(12) United States Patent
Kim et al.

(10) Patent No.: US 6,522,593 B2
(45) Date of Patent: Feb. 18, 2003

(54) SENSE AMPLIFIER CIRCUIT FOR SEMICONDUCTOR DEVICE

(75) Inventors: Sun Min Kim, Seoul (KR); Yong Hwan Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/989,594

(22) Filed: Nov. 20, 2001

(65) Prior Publication Data

US 2002/0081789 A1 Jun. 27, 2002

(30) Foreign Application Priority Data

Nov. 21, 2000 (KR) ............................................... 00-69288

(51) Int. Cl.[7] ................................................. G11C 7/00
(52) U.S. Cl. .................................. 365/205; 365/189.11
(58) Field of Search .............................. 365/205, 189.11

(56) References Cited

U.S. PATENT DOCUMENTS 5,544,110 A * 8/1996 Yuh ............................ 365/205
6,061,278 A * 5/2000 Kato et al. ................... 365/190
6,320,798 B1 * 11/2001 Jo et al. ................... 365/189.11

\* cited by examiner

Primary Examiner—David Nelms
Assistant Examiner—Connie C. Yoha
(74) Attorney, Agent, or Firm—Ladas & Parry

(57) ABSTRACT

A sense amplifier circuit for a semiconductor device which can reduce current consumption by reducing the operation time of a pull-up driver for supplying the power voltage to a sense amp when a power voltage is higher than a reference voltage, and which can improve operation properties by increasing the operation time of the pull-up driver when the power voltage is lower than the reference voltage. The sense amplifier circuit includes: a first and a second pull-up drivers; a first and a second pull-down drivers; a voltage detecting unit; and selecting driver unit for respectively controlling operations of the first and the second pull-up drivers and the first and the second pull-down drivers according to the output signal of the voltage detecting unit.

9 Claims, 6 Drawing Sheets

SENSE AMPLIFIER CIRCUIT FOR SEMICONDUCTOR DEVICE

BACKGROUND OF THE INVENTION

1. Field of the Invention

The present invention relates to a sense amp circuit for a semiconductor device, and in particular to an improved sense amp circuit for a semiconductor device which can reduce current consumption when a power voltage is high, and which can improve an operation property of a sense amp when the power voltage is low, by adjusting a pull-up bias voltage and a pull-down bias voltage of the sense amp according to a magnitude of the power voltage.

2. Description of the Background Art

FIG. 1 is a structure diagram illustrating a conventional sense amp and a control circuit thereof, including a memory cell unit 10, a selecting driver unit 20 and a sense amp unit 30.

The memory cell unit 10 is composed of a plurality of memory cells. The sense amp unit 30 senses and amplifies the data from the memory cell unit 10 in a read operation, or senses and amplifies an input data in a write operation and stores it in the memory cell unit 10.

The selecting driver unit 20 generates first and second pull-up control signals SP1B and SP2B for sequentially supplying an external voltage EX_VDD and an internal voltage VDC to a pull-up bias node A of the sense amp according to a sense amp enable signal SAEN and an address decoding signal, and also generates a pull-down control signal SN1 for discharging a voltage of a pull-down bias node B of the sense amp to a ground voltage Vss.

FIG. 2 is a circuit diagram illustrating the selecting driver unit 20 of FIG. 1.

The selecting driver unit 20 receives the address decoding signal and the sense amp enable signal SAEN, and generates the first and second pull-up control signals SP1B and SP2B and the pull-down control signal SN1. The first pull-up control signal SP1B controls an operation of an NMOS transistor N3 supplying the external power voltage EX_VDD to the sense amp pull-up bias potential A in the sense amp operation, and the second pull-up control signal SP2B controls an operation of an NMOS transistor N4 supplying the internal power voltage VDC to the sense amp pull-up bias node A in the sense amp operation. In addition, the pull-down control signal SN1 controls an operation of an NMOS transistor N5 discharging a voltage of the sense amp pull-down bias node B to the ground voltage Vss in the sense amp operation.

Here, the first pull-up control signal SP1B operates the NMOS transistor N3 in an initial operation of the sense amp, thereby supplying the external voltage EX_VDD to the pull-up bias node A of the sense amp. Accordingly, the sense amp is over-driven in its initial operation. At this time, the sense amp receives the external voltage EX_VDD, and rapidly pulls up the pull-up bias node A in a high power voltage VDD. Thereafter, the second pull-up control signal SP2B is enabled to turn on the NMOS transistor N4, thereby supplying the internal power voltage VDC to the pull-up bias node A. As a result, the sense amp is stably operated by the pull-up bias node A having the internal power voltage VDC.

However, in the conventional sense amp and the control circuit thereof, the external power voltage EX_VDD is supplied to the pull-up bias node A of the sense amp according to the first pull-up control signal SP1B in the initial operation of the sense amp. Here, the first pull-up control signal SP1B has a constant pulse width regardless of a magnitude of the power voltage VDD. When the power voltage VDD is high, a large current is unnecessarily supplied to the sense amp, which increases current consumption. In the case that the power voltage VDD is low, the current is not sufficiently supplied to the pull-up bias node A of the sense amp in a fixed pulse period, thereby deteriorating the operation of the sense amp.

Moreover, the pull-down bias node B of the sense amp pulls down the pull-down bias potential B according to one pull-down control signal SN1. As identical to the pull-up bias potential A, the pull-down bias node B does not sufficiently pull down the pull-down bias potential B in a low power voltage VDD.

SUMMARY OF THE INVENTION

Accordingly, it is an object of the present invention to provide a sense amp circuit for a semiconductor device which can reduce current consumption when a power voltage is high, and which can improve an operation property of a sense amp when the power voltage is low, by adjusting a pull-up bias voltage and a pull-down bias voltage of the sense amp according to a magnitude of the power voltage.

In order to achieve the above-described object of the invention, there is provided a sense amp circuit for a semiconductor device, including: a first pull-up driver for supplying an external power voltage to a pull-up bias node of the sense amp according to a first pull-up control signal; a second pull-up driver for supplying an internal power voltage to the pull-up bias node according to a second pull-up control signal; a first pull-down driver for discharging a voltage of a pull-down bias node of the sense amp into a ground voltage according to the first pull-down control signal; a second pull-down driver for discharging a voltage of the pull-down bias node into a ground voltage according to a second pull-down control signal; a voltage detector for generating a detecting signal by comparing a magnitude of the internal power voltage with a reference voltage according to a word line control signal before the sense amp operation; and a selecting driver for receiving the detecting signal, an address decoding signal and a sense amp enable signal, for generating the first pull-up control signal having a first pulse width in an initial operation of the sense amp, generating the second pull-up control signal, and generating the first pull-down control signal according to the sense amp enable signal when the internal power voltage is high according to the detecting signal, and for generating the first pull-up control signal having a second pulse width greater than the first pulse width in the initial operation of the sense amp, generating the second pull-up control signal, and generating the first and second pull-down control signals according to the sense amp enable signal when the internal power voltage is low.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
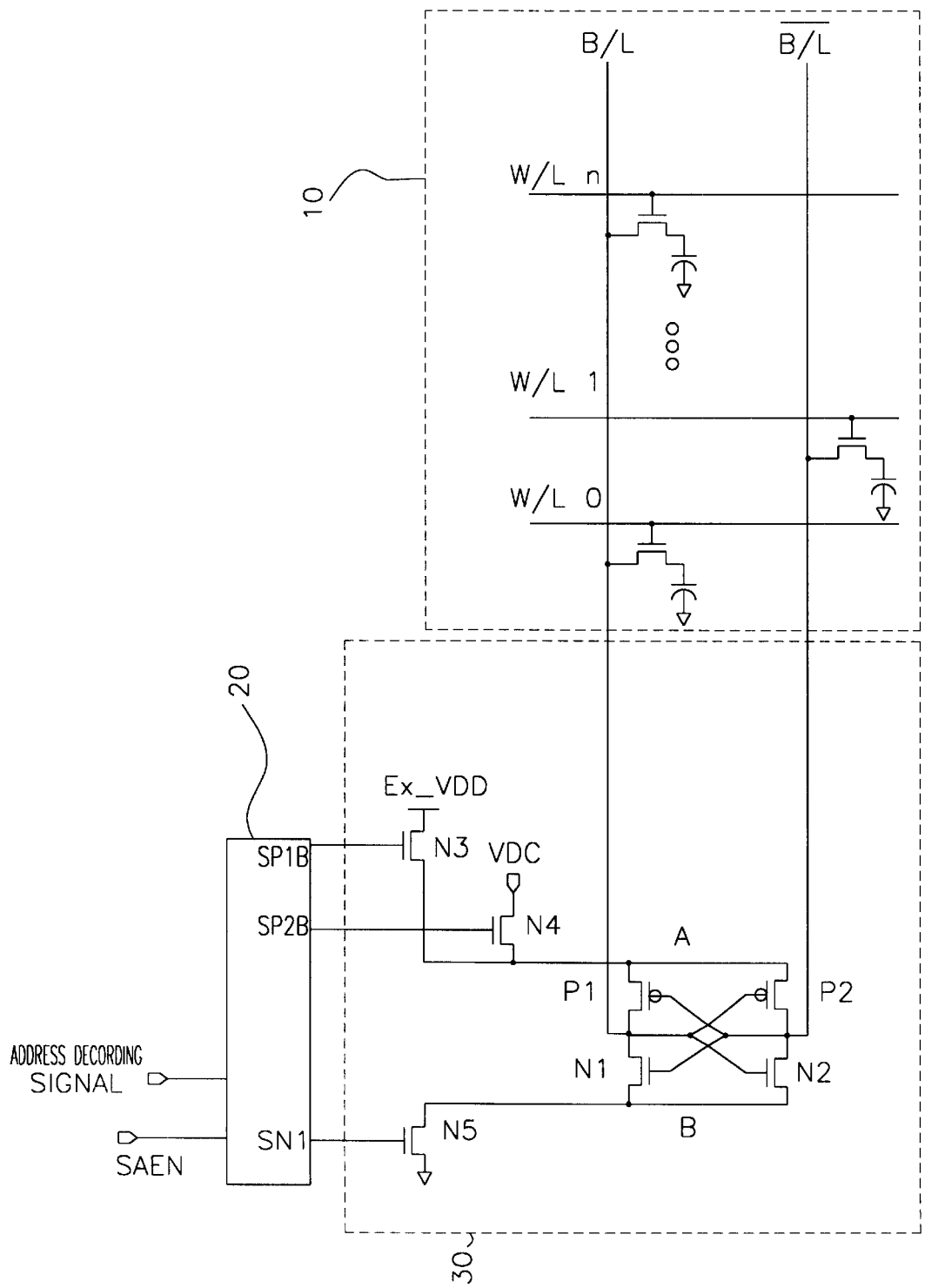
FIG. 1 is a structure diagram illustrating a conventional sense amp circuit.
Figure 2:
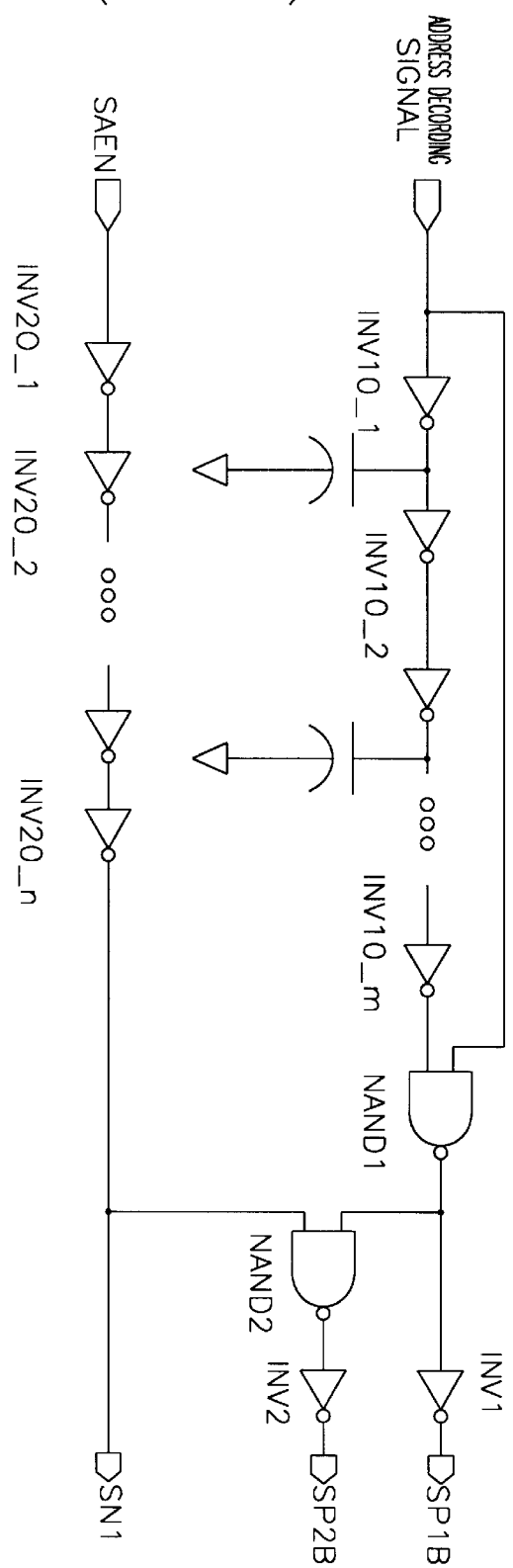
FIG. 2 is a circuit diagram illustrating a selecting driver unit of FIG. 1.

A sense amp circuit for a semiconductor device in accordance with a preferred embodiment of the present invention will now be described in detail with reference to the accompanying drawings.

In the following description, same drawing reference numerals are used for the same elements even in different drawings, and explanations thereof will be omitted.

Figure 3:
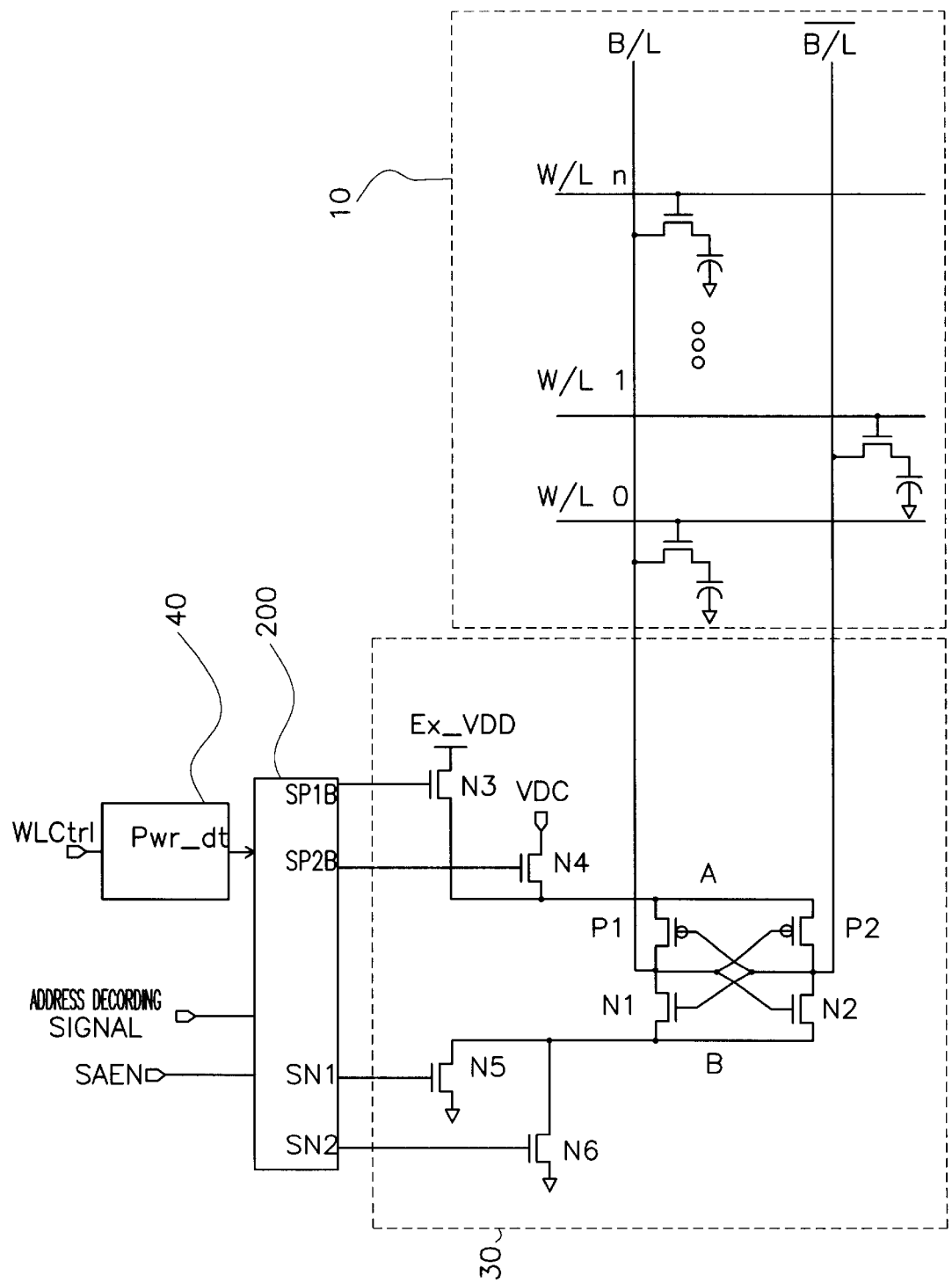
FIG. 3 is a structure diagram illustrating a sense amp circuit in accordance with the present invention.

FIG. 3 is a circuit diagram illustrating a sense amp and a control circuit thereof in accordance with the present invention, including a memory cell unit 10, a sense amp unit 30, a voltage detecting unit 40 and a selecting driver unit 200.

The memory cell unit 10 is composed of a plurality of memory cells.

The sense amp unit 30 senses and amplifies the data from the memory cell unit 10 in a read operation and outputs it to a data bus line, or senses and amplifies a data inputted through the data bus line in a write operation and outputs it to the memory cell unit 10.

Here, the sense amp unit 30 is formed in a cross-coupled latch type, and includes first and second pull-up drivers N3 and N4, and first and second pull-down driers N5 and N6. The first pull-up driver N3 is operated according to a control signal SP1B from the selecting driver unit 200, for supplying an external power voltage EX_VDD to a pull-up bias node A of the sense amp. The first pull-up driver N3 is operated in an initial operation of the sense amp, for over-driving the sense amp.

The second pull-up driver N4 is operated according to a control signal SP2B from the selecting driver unit 200, for supplying an internal power voltage VDC to the pull-up bias node A of the sense amp. The second pull-up driver N4 is operated after the first pull-up driver N3 is disabled.

The first pull-down driver N5 is operated according to a control signal SN1 from the selecting driver unit 200, for discharging a voltage of a pull-down bias node B of the sense amp into a ground voltage Vss. The first pull-down driver N5 is operated in the operation of the sense amp.

The second pull-down driver N6 is operated according to a control signal SN2 from the selecting driver unit 200, for discharging a voltage of the pull-down bias node B of the sense amp into a ground voltage Vss. The second pull-down driver N6 is operated with the first pull-down driver N5 in the operation of the sense amp.

The voltage detecting unit 40 generates a signal $Pwr_{13}dt$ detecting a magnitude of the power voltage VDD according to a word line control signal WLCtrl.

The selecting driver unit 200 generates the control signals SP1B and SP2B for supplying the external voltage EX_VDD and the internal voltage VDC to the pull-up bias potential A of the sense amp unit 30 according to the output signal Pwr_dt from the voltage detecting unit 40, and also generates the pull-down control signals SN1 and SN2 for supplying the ground voltage Vss to the pull-down bias potential B of the sense amp unit 30 according to the output signal $Pwr_{13}$ dt from the voltage detecting unit 40.

Figure 6:
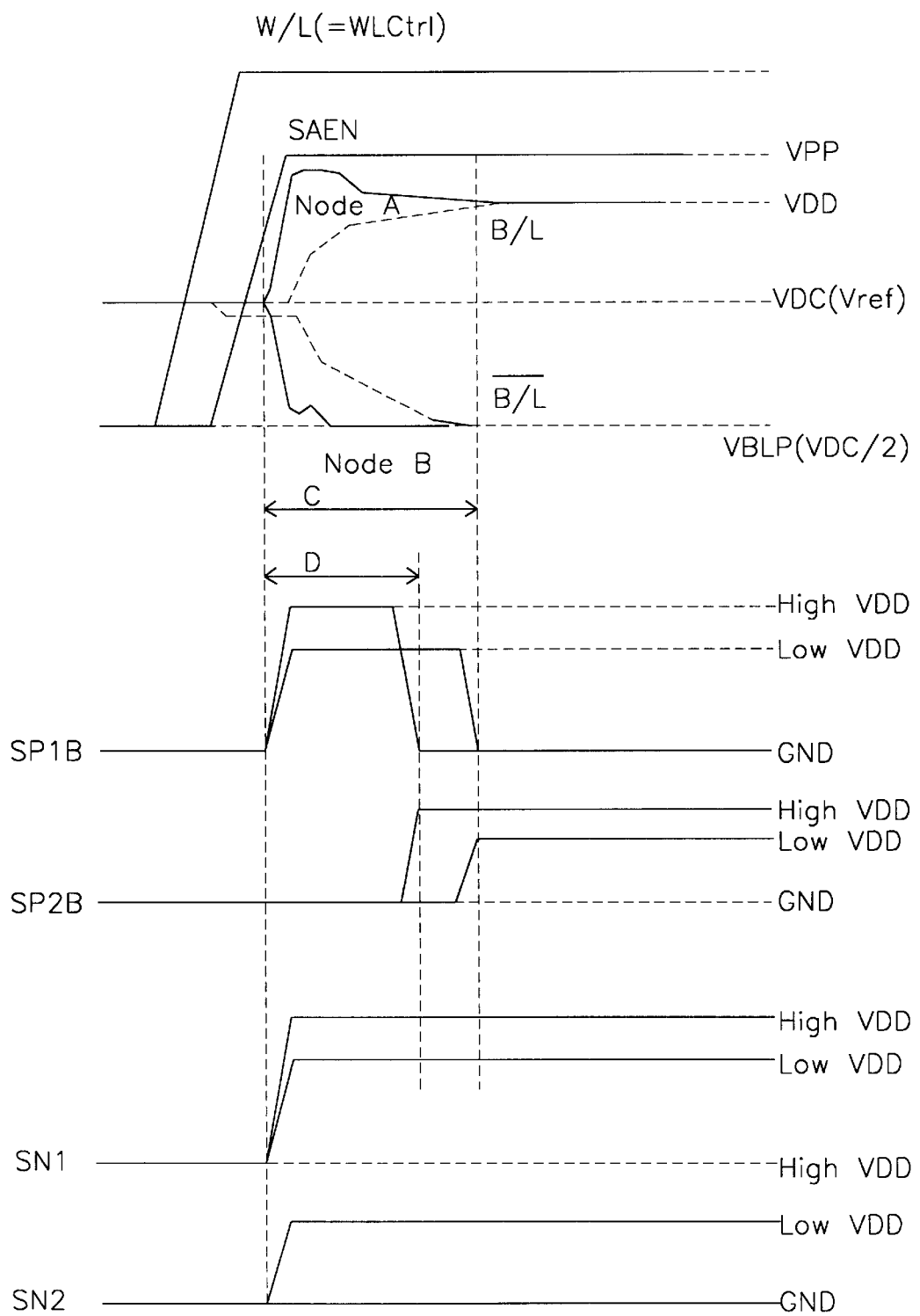
FIG. 6 is an operation timing diagram of the sense amp circuit in accordance with the present invention.

Referring to FIG. 6, the control signal SP1B has a pulse period of D when the power voltage VDD has a high level, and a pulse period of C when the power voltage VDD has a low level (D<C).

The control signal SP2B is enabled in an end point of the D pulse period of the control signal SP1B when the power voltage VDD has a high level, and in an end point of the C pulse period of the control signal SP1B when the power voltage VDD has a low level. Here, the control signal SP2B has a higher voltage level in the high power voltage VDD than the low power voltage VDD.

The control signal SN1 is generated according to the sense amp enable signal SAEN, and has a higher voltage level in the high power voltage VDD than the low power voltage VDD.

The control signal SN2 is generated according to the sense amp enable signal SAEN, and is only generated in the low power voltage VDD.

Figure 4:
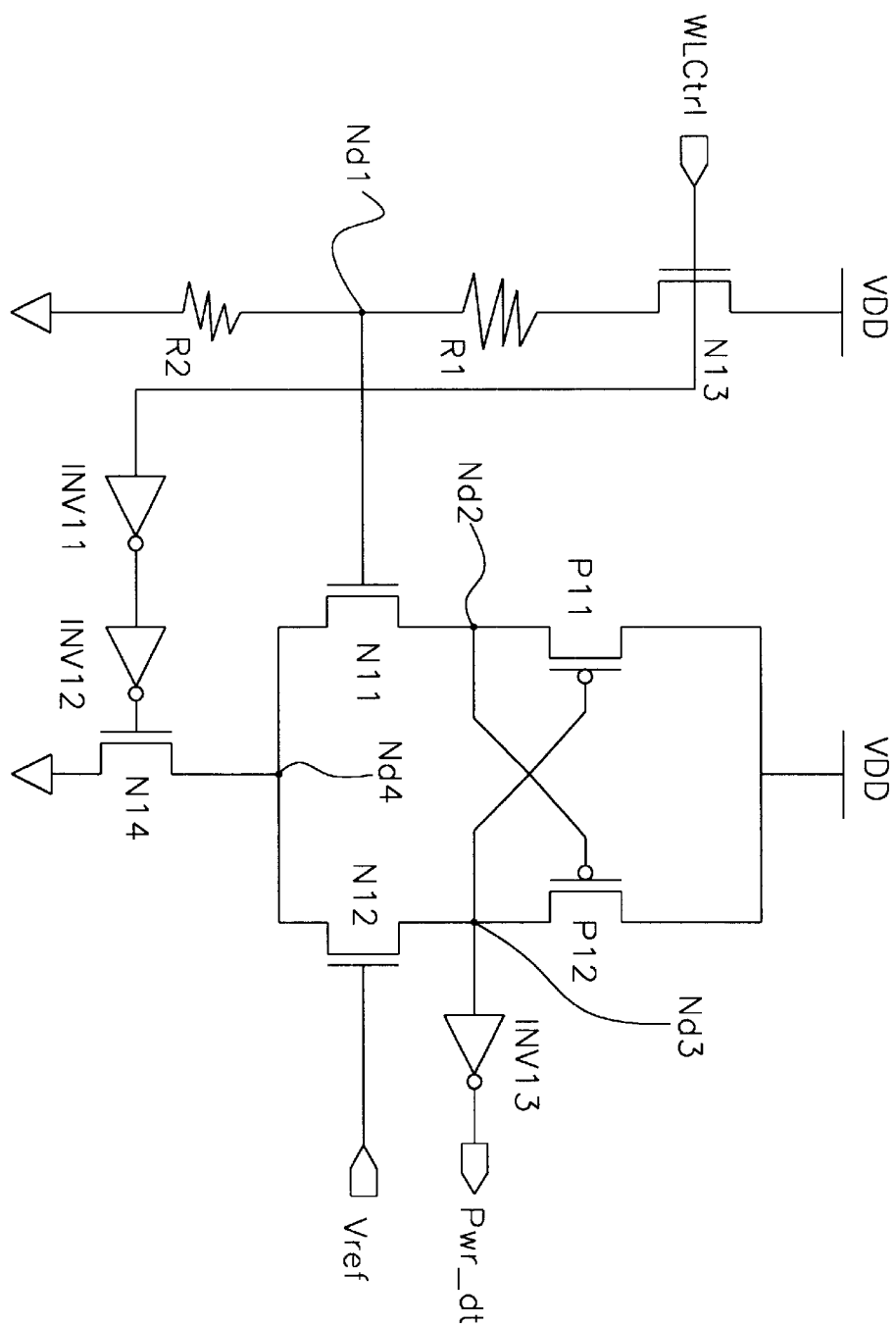
FIG. 4 is a circuit diagram illustrating a voltage detecting unit of FIG. 3.

FIG. 4 is a circuit diagram illustrating the voltage detecting unit 40 of FIG. 3. The voltage detecting unit 40 includes: an NMOS transistor N13 for outputting the power voltage VDD inputted to its source terminal to its drain terminal according to the word line control signal WLCtrl; a resistance R1 connected between the drain terminal of the NMOS transistor N13 and a node Nd1; a resistance R2 connected between the node Nd1 and the ground voltage Vss; a PMOS transistor P12 for outputting the power voltage VDD to a node Nd3 according to a voltage level of the node Nd2; a PMOS transistor P11 for outputting the power voltage VDD to the node Nd2 according to a voltage level of the node Nd3; an NMOS transistor N11 for outputting a voltage of the node Nd2 to a node Nd4 according to a voltage level of the node Nd1; an NMOS transistor N12 for outputting a voltage of the node Nd3 to the node Nd4 according to a reference voltage Vref; an NMOS transistor N14 for discharging a voltage of the node Nd4 to the ground voltage Vss according to the word line control signal WLCtrl outputted through inverters INV11 and INV12; and an inverter INV13 for inverting the signal of the node Nd3, and outputting the inverted signal to the output terminal $Pwr_{13}$ dt.

When the word line control signal WLCtrl has a high level, the voltage detecting unit 40 compares the power voltage VDD with the reference voltage Vref, to detect a magnitude of the power voltage VDD. That is, when the word line WL is enabled, the voltage detecting unit 40 is operated to detect a high or low state of the power voltage VDD. Thereafter, when the sense amp enable signal SAEN and the address decoding signal are inputted, the control signals SP1B, SP2B, SN1 and SN2 are generated to control the operation voltage of the sense amp.

Here, when the externally-supplied power voltage VDD is detected as a high level according to the signal $Pwr_{13}$ dt from the voltage detecting unit 40, a delay pulse width of the control signal SP1B is reduced to decrease an over-driving period of the sense amp, and the power is supplied in the internal voltage VDC according to the control signal SP2B, thereby reducing current consumption. In addition, the pull-down portion generates only the control signal SN1 to operate one pull-down transistor N5, thereby reducing current consumption.

Conversely, when the externally-supplied power voltage VDD is detected as a low level, the delay pulse width of the control signal SP1B is increased to enlarge the over-driving portion of the sense amp, so that the pull-up bias node A can be sufficiently pulled up. The pull-down portion generates the control signals SN1 and SN2 to operate the pull-down transistors N5 and N6, so that the potential of the pull-down bias node B can be rapidly pulled down to the ground voltage Vss.

Figure 5:
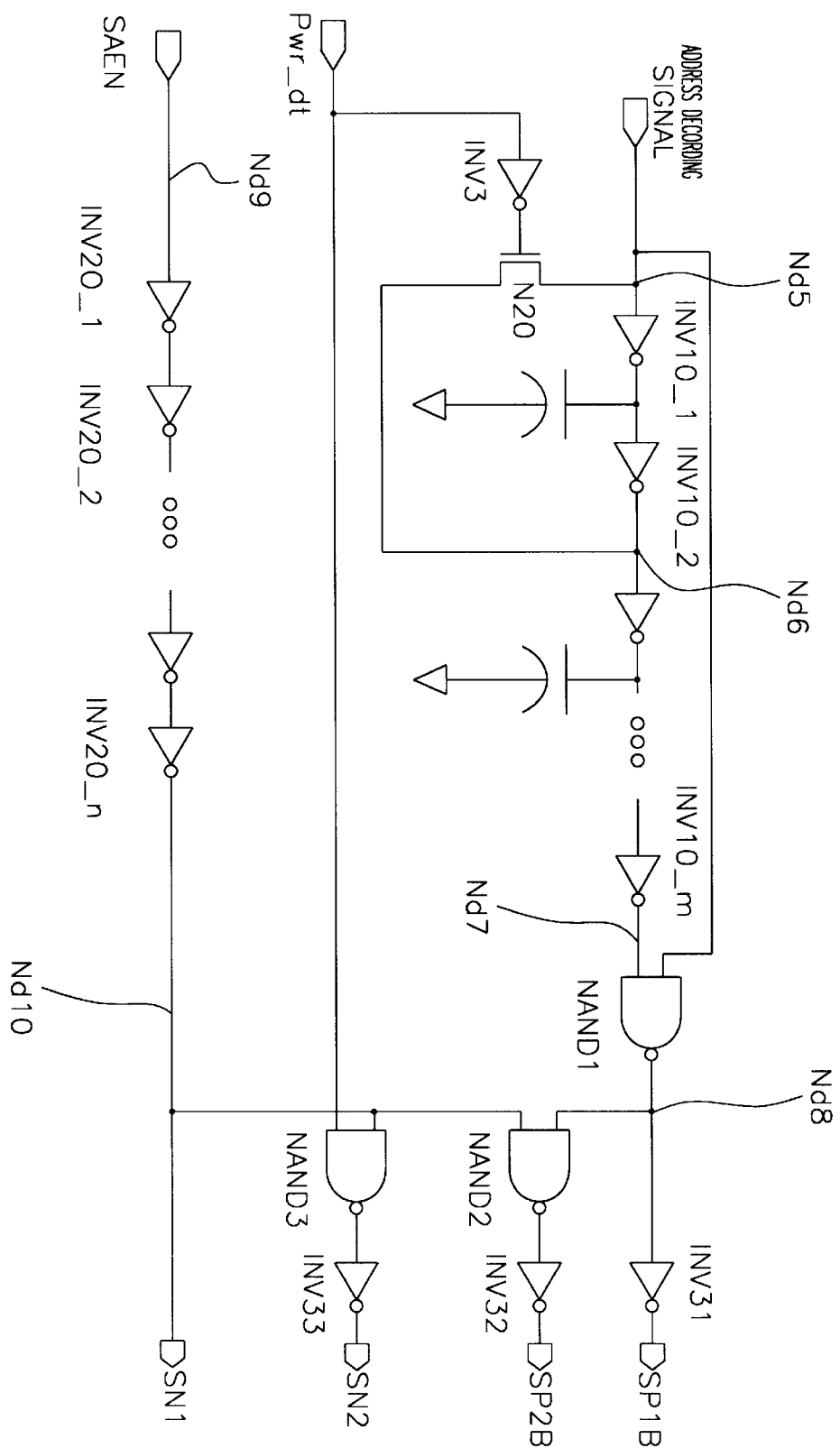
FIG. 5 is a circuit diagram illustrating a selecting driver unit of FIG. 3.

FIG. 5 is a circuit diagram illustrating the selecting driver unit 200 of FIG. 3. The selecting driver unit 200 includes: an odd number of inverters INV10_1~INV10_m connected in series between a node Nd5 receiving the address decoding signal and a node Nd7; an NMOS transistor N20 for switching the address decoding signal of the node Nd5 to an output node of the inverter INV10_2 according to the output signal $Pwr_{13}$ dt from the voltage detecting unit 40; a NAND gate NAND1 for NANDing the address decoding signal inputted to the node Nd5 and the signal of the node Nd7 outputted from the inverter INV10_m; an inverter INV31 for inverting a signal of a node Nd8 outputted from the NAND gate ND1, and outputting the first pull-up control signal SP1B; an even number of inverters INV20_1~INV20_n connected in series between a node Nd9 receiving the sense amp enable signal SAEN and a node Nd10 outputting the first pull-down control signal SN1; a NAND gate NAND2 for NANDing the signal of the node Nd8 and a signal of a node Nd10; an inverter INV32 for inverting the output signal from the NAND gate NAND2, and outputting the second pull-up control signal SP2B; a NAND gate NAND3 for NANDing the signal of the node Nd8 and the output signal $Pwr_{13}$ dt from the voltage detecting unit 40; and an inverter INV33 for inverting the output signal from the NAND gate NAND3, and outputting the second pull-down control signal SN2.

The selecting driver unit 200 receives the address decoding signal, the sense amp enable signal SAEN and the output signal $Pwr_{13}$ dt from the voltage detecting unit 40, and generates the control signals SP1B, SP2B, SN1 and SN2.

When the power voltage VDD is high, the selecting driver unit 200 shortens a pulse period of the control signal SP1B to reduce an operation time of the pull-up driver N3 supplying the external voltage EX_VDD, and generates the control signal SP2B to supply the internal voltage VDC to the pull-up bias node A by the pull-up driver N4. In addition, the selecting driver unit 200 generates the control signal SN1 to merely operate the pull-down driver N5, and disables the control signal SN2.

When the power voltage VDD is low, the selecting driver unit 200 increases a pulse period of the pull-up control signal, thereby increasing an operation time of the pull-up driver N3. Here, the NMOS transistor N20 of the select driver unit 200 is turned off according to the output signal $Pwr_{13}$ dt from the voltage detecting unit 40. Thus, a delay period of the signal outputted to the node Nd7 through the inverters INV10_1~INV10_13 m is increased. Accordingly, the operation time of the pull-up driver N3 is increased by extending the pulse period of the pull-up control signal. The pull-down drivers N5 and N6 are operated according to the pull-down control signals SN1 and SN2.

As discussed earlier, in accordance with the present invention, the over-driving period of the sense amp is efficiently adjusted by using the voltage detecting circuit, which results in reduced current consumption. Moreover, the pull-down operation of the sense amp is efficiently controlled by using the voltage detecting circuit, thereby improving the property of the sense amp in the low power voltage period.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A sense amplifier circuit for a semiconductor device, comprising:

a first pull-up driver for supplying an external power voltage to a pull-up bias node of the sense amp according to a first pull-up control signal;

a second pull-up driver for supplying an internal power voltage to the pull-up bias node according to a second pull-up control signal;

a first pull-down driver for discharging a voltage of a pull-down bias node of the sense amp into a ground voltage according to the first pull-down control signal;

a second pull-down driver for discharging a voltage of the pull-down bias node into a ground voltage according to a second pull-down control signal;

a voltage detector for generating a detecting signal by comparing a magnitude of the internal power voltage with a reference voltage according to a word line control signal before the sense amp operation; and a selecting driver for receiving the detecting signal, an address decoding signal and a sense amp enable signal, for generating the first pull-up control signal having a first pulse width in an initial operation of the sense amp, generating the second pull-up control signal, and generating the first pull-down control signal according to the sense amp enable signal when the internal power voltage is high according to the detecting signal, and for generating the first pull-up control signal having a second pulse width greater than the first pulse width in the initial operation of the sense amp, generating the second pull-up control signal, and generating the first and second pull-down control signals according to the sense amp enable signal when the internal power voltage is low.

2. The circuit according to claim 1, wherein the first and second pull-up drivers are NMOS transistors.

3. The circuit according to claim 1, wherein the first and second pull-up drivers are PMOS transistors.

4. The circuit according to claim 1, wherein the first and second pull-down drivers are NMOS transistors.

5. The circuit according to claim 1, wherein the sense amplifier circuit is a cross-coupled latch type.

6. The circuit according to claim 1, wherein the voltage detector comprises:

a voltage distributor operated according to the word line control signal, for receiving the internal power voltage, and generating a voltage-distributed signal; and a differential amplifier operated according to the word line control signal, for receiving the output signal from the voltage distributor and the reference voltage, and generating the differential-amplified signal as the detecting signal.

7. The circuit according to claim 6, wherein, in the voltage distributor, an NMOS transistor switched according to the word line control signal and two resistances are connected in series between the power voltage and the ground voltage.

8. The circuit according to claim 6, wherein the differential amplifier is a cross-coupled type.

9. The circuit according to claim 1, wherein the selecting driver comprises:

a first NAND gate for receiving the address decoding signal and a delay signal of the address decoding signal;

a first inverter for inverting the output signal from the first NAND gate, and outputting the first pull-up control signal;

a delay unit including a plurality of inverters for delaying the sense amp enable signal, and generating the first pull-down control signal;

a second NAND gate for receiving the output signal from the first NAND gate and the output signal from the delay unit;

a second inverter for inverting the output signal from the second NAND gate, and outputting the second pull-up control signal;

a third NAND gate for receiving the detecting signal and the output signal from the delay unit; and a third inverter for inverting the output signal from the third NAND gate, and generating the second pull-down control signal.

* * * * *